(12) United States Patent
Oak et al.

(10) Patent No.: US 11,495,554 B2
(45) Date of Patent: Nov. 8, 2022

(54) CONFIGURABLE CAPACITOR

(71) Applicant: Empower Semiconductor, Inc., Milpitas, CA (US)

(72) Inventors: Parag Oak, Sunnyvale, CA (US); Timothy Alan Phillips, Hope, RI (US); Trey Roessig, Boston, MA (US); Peter Huang, Newark, CA (US)

(73) Assignee: Empower Semiconductor, Inc., Milpitas, CA (US)

( * ) Notice: Subject to any disclaimer, the term of this patent is extended or adjusted under 35 U.S.C. 154(b) by 0 days.

(21) Appl. No.: 17/085,514

(22) Filed: Oct. 30, 2020

(65) Prior Publication Data
US 2021/0134740 A1    May 6, 2021

Related U.S. Application Data

(60) Provisional application No. 62/929,614, filed on Nov. 1, 2019.

(51) Int. Cl.
| | | |
|---|---|---|
| *H01L 23/64* | (2006.01) | |
| *H01L 23/498* | (2006.01) | |
| *H01L 23/48* | (2006.01) | |
| *H01L 49/02* | (2006.01) | |

(52) U.S. Cl.
CPC .......... *H01L 23/642* (2013.01); *H01L 23/481* (2013.01); *H01L 23/49838* (2013.01); *H01L 23/645* (2013.01); *H01L 23/647* (2013.01); *H01L 28/10* (2013.01); *H01L 28/20* (2013.01); *H01L 28/40* (2013.01)

(58) Field of Classification Search
CPC .............................. H01L 23/642; H01L 28/60
See application file for complete search history.

(56) References Cited

U.S. PATENT DOCUMENTS

| | | | | |
|---|---|---|---|---|
| 5,912,044 A | * | 6/1999 | Farooq | H01L 28/40 427/79 |
| 2006/0097344 A1 | * | 5/2006 | Casper | H05K 1/162 257/528 |
| 2008/0186654 A1 | | 8/2008 | Takeshima et al. | |

(Continued)

FOREIGN PATENT DOCUMENTS

| | | |
|---|---|---|
| JP | 2016167619 A | 9/2016 |
| JP | 2018190757 | 11/2018 |

(Continued)

OTHER PUBLICATIONS

International Patent Application No. PCT/US2020/058251, International Search Report and Written Opinion, dated Feb. 19, 2021, 11 pages.

(Continued)

*Primary Examiner* — Moin M Rahman
(74) *Attorney, Agent, or Firm* — Kilpatrick Townsend & Stockton LLP

(57) ABSTRACT

A configurable capacitance device includes a semiconductor substrate including a plurality of integrally formed capacitors; and a separate interconnect structure coupled to the semiconductor substrate, wherein the separate interconnect structure is configurable to electrically couple two or more of the plurality of integrally formed capacitors together in a parallel configuration.

16 Claims, 12 Drawing Sheets

(56) References Cited

U.S. PATENT DOCUMENTS

| | | | |
|---|---|---|---|
| 2011/0299337 A1* | 12/2011 | Parris | H01L 27/11558 |
| | | | 365/185.18 |
| 2012/0081870 A1* | 4/2012 | Randall | H01L 23/50 |
| | | | 361/782 |
| 2013/0154109 A1* | 6/2013 | Venkatraman | H01L 23/4926 |
| | | | 257/774 |
| 2013/0169308 A1* | 7/2013 | Ouyang | H01L 22/34 |
| | | | 324/762.03 |
| 2013/0201599 A1 | 8/2013 | Kumada et al. | |
| 2016/0197059 A1 | 7/2016 | Lin et al. | |
| 2017/0018550 A1* | 1/2017 | Shih | H01G 4/30 |
| 2017/0301516 A1* | 10/2017 | Bhutta | H01J 37/32935 |
| 2017/0338038 A1 | 11/2017 | Nakaiso | |
| 2018/0004320 A1 | 1/2018 | Polishchuk et al. | |
| 2018/0342467 A1 | 11/2018 | Lim et al. | |
| 2019/0198420 A1 | 6/2019 | Schmit et al. | |
| 2020/0176427 A1* | 6/2020 | Ramachandran | H01L 22/20 |

FOREIGN PATENT DOCUMENTS

| | | |
|---|---|---|
| TW | 200414835 A | 8/2004 |
| TW | 201426971 | 7/2014 |
| TW | 201608902 | 3/2016 |
| TW | 201727870 | 8/2017 |

OTHER PUBLICATIONS

Office Action from related application, Taiwanese Application No. TW109137969 , dated Nov. 12, 2021, 9 pages.

TW109137969, "Office Action", dated Mar. 9, 2022, 9 pages.

"Ultra-Broadband Diff Si Cap Pairs, UBDC (2×10nF / 0402M / BV=11V)", Murata Silicon Capacitors—UBDC421.510, Rev. 1.9, Technical Datasheet—Ref:TDS0401UBB1.9, FBC-0001-04, Revision Release 1.9, Apr. 20, 2020, 9 pages.

* cited by examiner

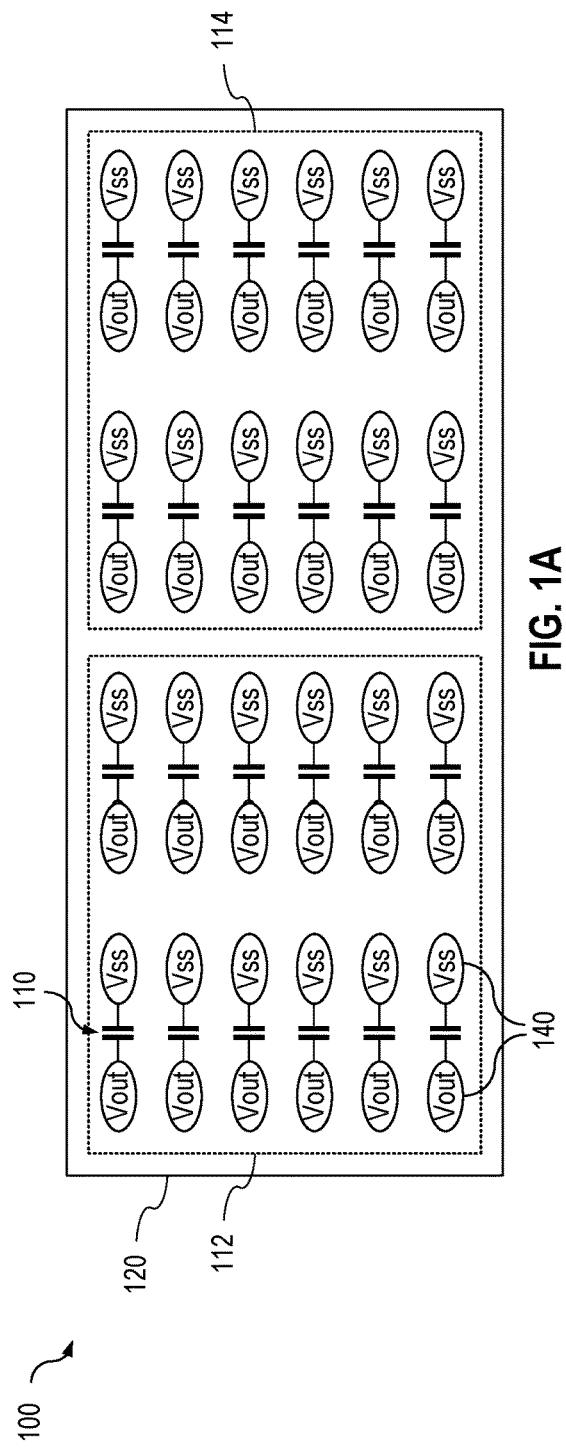
FIG. 1A
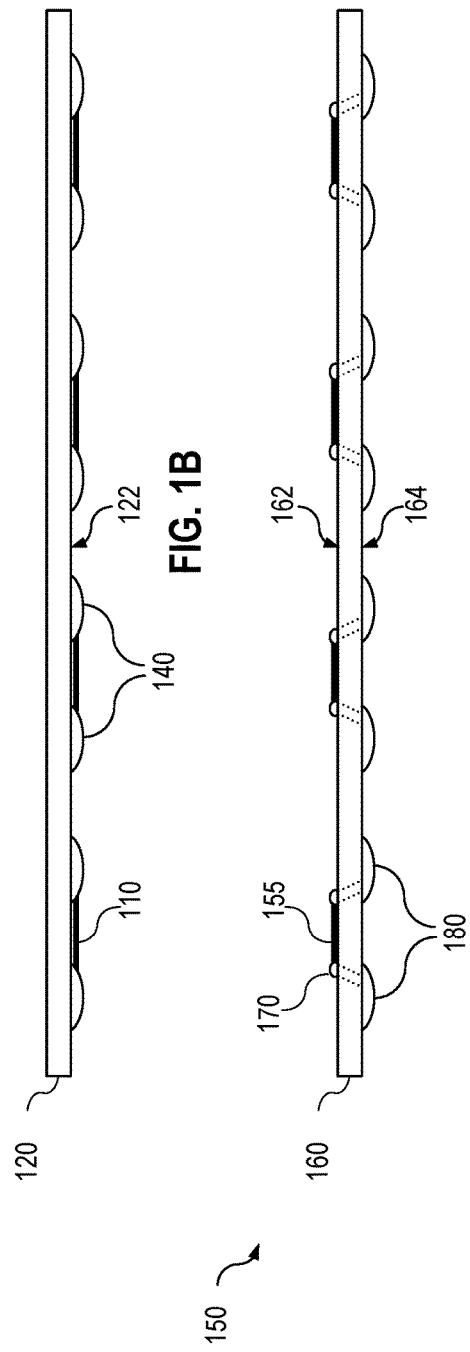
FIG. 1B
FIG. 1C

CONFIGURABLE CAPACITOR

CROSS-REFERENCES TO RELATED APPLICATIONS

This application claims the benefit of U.S. Provisional Application No. 62/929,614, filed Nov. 1, 2019; the content of which is hereby incorporated herein by reference in its entirety.

BACKGROUND

Unless otherwise indicated herein, the materials described in this section are not prior art to the claims in this application and are not admitted to be prior art by inclusion in this section.

Switching DC/DC voltage regulators, as well as other electronic circuits, use decoupling capacitors to reduce voltage ripple and noise on input and output voltage lines. Miniaturization and integration of electronic circuit components leads to need for multiple high density, small footprint capacitors. One approach has been to stack multiple discrete capacitors on a printed circuit board or integrated circuit package. This approach can result in poor overall capacitor characteristics, a larger circuit footprint, and wasted board space between the capacitors due to finite spacing rules for discrete capacitors.

SUMMARY

Aspects of the present disclosure relate to capacitors, and more particularly, though not necessarily exclusively, configurable capacitors in an integrated package.

According to various aspects there is provided a configurable capacitance device. In some aspects, the configurable capacitance device may include: a semiconductor substrate including a plurality of integrally formed capacitors; and a separate interconnect structure coupled to the semiconductor substrate, wherein the separate interconnect structure is configurable to electrically couple two or more of the plurality of integrally formed capacitors together in a parallel configuration.

According to various aspects there is provided a configurable capacitance system. In some aspects, the configurable capacitance system may include: an electronic package; a multi-capacitor device disposed within the electronic package, the multi-capacitor device having a semiconductor substrate including a plurality of integrally formed capacitors; an integrated circuit (IC) disposed within the electronic package, the IC operable to perform a circuit function; and an interconnect structure forming a portion of the electronic package, wherein the interconnect structure is configurable to electrically couple two or more of the plurality of integrally formed capacitors together in a parallel configuration, and to couple the parallel configuration to the IC.

According to various aspects there is provided a configurable capacitance device. In some aspects, configurable capacitance device may include: a semiconductor substrate including a plurality of integrally formed capacitors; and a separate interconnect structure coupled to the semiconductor substrate, wherein the separate interconnect structure is configurable to electrically couple two or more of the plurality of integrally formed capacitors together in at least one of a series configuration or a parallel configuration.

BRIEF DESCRIPTION OF THE DRAWINGS

Various embodiments in accordance with the present disclosure will be described with reference to the drawings, in which:

FIG. 1A is a diagram illustrating a representative example of a configurable capacitance chip according to some aspects of the present disclosure;

FIG. 1B is a diagram illustrating a side view of the representative example of the configurable capacitance chip in FIG. 1A according to some aspects of the present disclosure.

FIG. 1C is a diagram illustrating a side view of another representative example of a configurable capacitance chip according to some aspects of the present disclosure.

DETAILED DESCRIPTION

Figure 2:
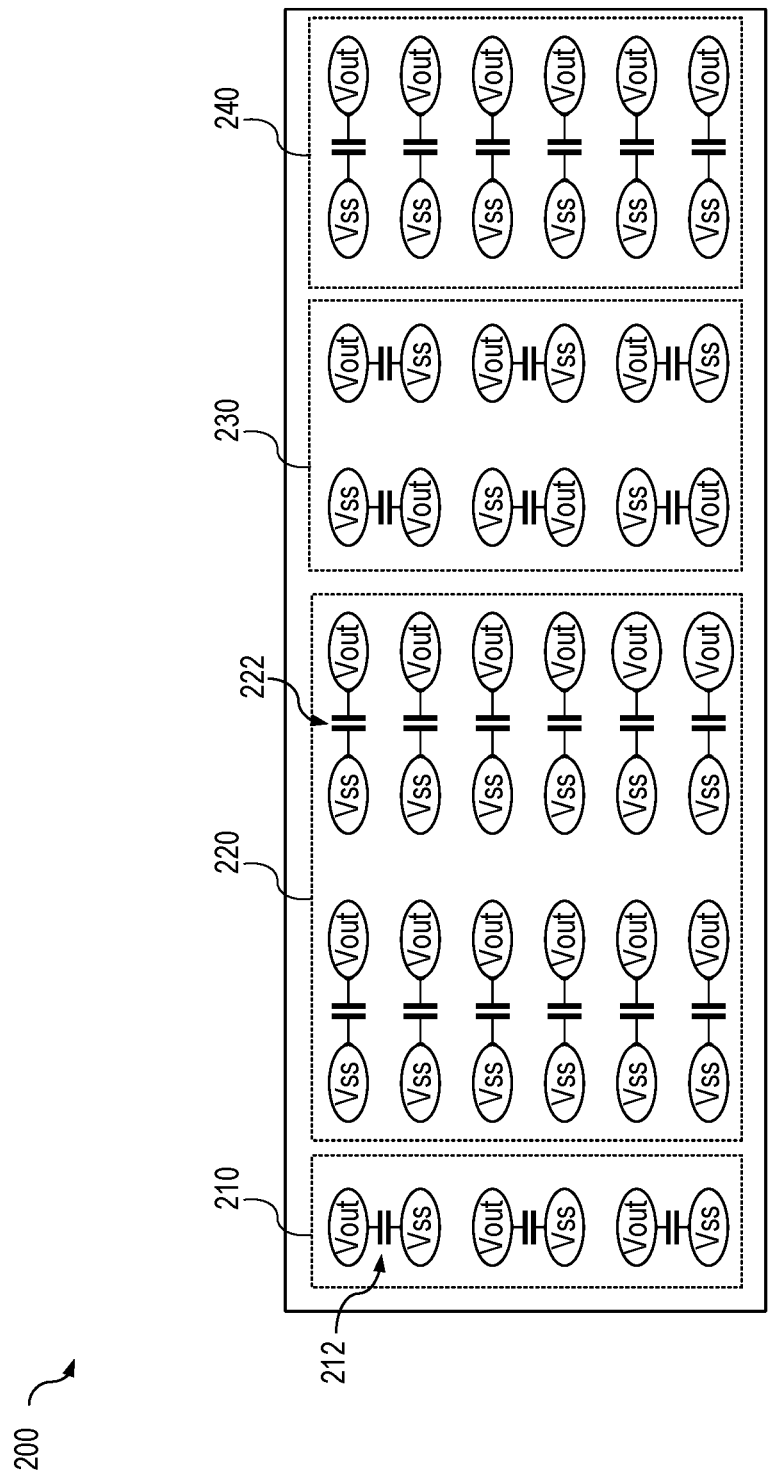
FIG. 2 is a diagram illustrating another representative example of a configurable capacitance chip according to some aspects of the present disclosure.

While certain embodiments are described, these embodiments are presented by way of example only, and are not intended to limit the scope of protection. The apparatuses, methods, and systems described herein may be embodied in a variety of other forms. Furthermore, various omissions, substitutions, and changes in the form of the example methods and systems described herein may be made without departing from the scope of protection.

Discrete capacitors may be used for a variety of applications. One such application is decoupling capacitors used to reduce voltage ripple and noise at input and output voltage lines of integrated circuits, for example, but not limited to, voltage regulators. As integrated circuits become increasingly miniaturized with circuit components being integrated on-chip, high density, small footprint capacitors with low Equivalent Series Resistance (ESR) and Equivalent Series Inductance (ESL) requirements that can be placed close to the integrated circuits are needed.

Aspects of the present disclosure may provide a method for configuring a desired amount of capacitance on a single chip. The configurable capacitance chip may be fabricated using standard semiconductor processing techniques. A configurable capacitance chip can provide flexibility and cost advantages as compared to placing multiple capacitors on a printed circuit board (PCB) or integrated circuit (IC) package. The configurable capacitance chip may be fabricated at lower cost as compared to the cost of multiple discrete capacitors, and can provide the ability to configure capacitor characteristics such as ESR and ESL at the package level. More specifically, in some embodiments a standardized capacitance chip can be used in different applications where the number and characteristics of capacitors formed by the capacitance chip are configured by changing electrical interconnects on the package substrate to which the capacitance chip is connected. In addition, the configurable capacitance chip may occupy less space on a PCB compared to discrete capacitors. The configurable capacitance chip may be applicable to any application where multiple capacitors are required.

FIG. 1A is a diagram illustrating a representative example of a configurable capacitance chip 100 according to some aspects of the present disclosure. FIG. 1B is a diagram illustrating a side view of the representative example of the configurable capacitance chip 100 in FIG. 1A according to some aspects of the present disclosure. Referring to FIGS. 1A and 1B, the configurable capacitance chip 100 may include a plurality of capacitors 110 fabricated on a first surface 122 of a substrate 120. Each capacitor 110 may be electrically connected to a pair of contacts, referred to herein as chip bumps 140, fabricated on the first surface 122 of the substrate 120. The chip bumps 140 may be, for example, solder bumps.

In some embodiments, a range of capacitance for each integrated capacitor can be between 10 and 10,000 nanofarads, in another embodiment can be between 50 and 5,000 nanofarads and in one embodiment between 50 and 500 nanofarads. In some embodiments, multiple capacitors 110 may be combined to provide larger or smaller capacitance values. The combined capacitors may be referred to as capacitor banks 112, 114. The capacitor banks 112, 114 may be formed, for example, by electrical connections fabricated on the first surface 122 of the substrate 120, by electrical connections fabricated on a substrate of an IC package to which the configurable capacitance chip 100 is attached, by traces on a PCB to which the IC package is attached, or by some combination. The electrical connections may be formed to provide parallel connections of capacitors, series connections of capacitors, or series-parallel combinations of capacitors.

FIG. 1C is a diagram illustrating a side view of another representative example of a configurable capacitance chip 150 according to some aspects of the present disclosure. Referring FIG. 1C, the configurable capacitance chip 150 may include a plurality of capacitors 155 fabricated on a first surface 162 of a substrate 160. Each capacitor 155 may be electrically connected to a pair of contacts 170 fabricated on the first surface 162 of the substrate 160. The contacts 170 fabricated on the first surface 162 of the substrate 160 may be electrically connected to contacts, referred to herein as chip bumps 180, fabricated on the second surface 164 of the substrate 160. The chip bumps 180 may be, for example, solder bumps. In some embodiments, multiple capacitors 110 may be combined into banks to provide larger or smaller capacitance values by electrical connections by electrical connections fabricated on the second surface 164 of the substrate 160, by electrical connections fabricated on a substrate of an IC package to which the configurable capacitance chip 150 is attached, by traces on a PCB to which the IC package is attached, or by some combination.

While FIG. 1A illustrates two banks 112, 114 having equal numbers of capacitors in each bank, the banks may be of various sizes depending on intended applications. In some implementations, the capacitors 110 may not be grouped in banks. Electrical connections between the capacitors are not limited to the capacitors within a bank of capacitors in implementations where capacitor banks are fabricated.

It should be appreciated that FIGS. 1A, 1B, and 1C are stylized representations of the configurable capacitance chip according to some aspects of the present disclosure, and are provided for ease of explanation. The figures are not meant to illustrate representative dimensions of any elements of the configurable capacitance chip. Further, the number of illustrated capacitors is merely representative and does not limit the number of capacitors or their relative placement provided by various embodiments. In addition, while the capacitor contacts 140 are labeled Vout and Vss in FIG. 1A, the labels are merely representative and are not to be construed as requiring the capacitor contacts 140 to be connected to Vout and Vss voltages.

FIG. 2 is a diagram illustrating another representative example of a configurable capacitance chip 200 according to some aspects of the present disclosure. Referring to FIG. 2, the configurable capacitance chip including four different banks 210-240 of capacitors are illustrated. As shown in FIG. 2, each bank 210-240 of capacitors may include different numbers of capacitors. In addition, the capacitors may be fabricated in different orientations. For example, the capacitors 212 in the first bank 210 are fabricated in a vertical direction, while the capacitors 222 in the second bank 220 are fabricated in a horizontal direction. A capacitor bank may include capacitors fabricated in both horizontal and vertical directions. The configurable capacitance chip 200 may be configured as a single capacitor (e.g., all capacitors coupled together) or as multiple capacitors (e.g., groups of capacitors coupled together).

It should be appreciated that FIG. 2 is a stylized representation of the configurable capacitance chip according to some aspects of the present disclosure, and is provided for ease of explanation. The figure is not meant to illustrate representative dimensions of any elements of the configurable capacitance chip. Further, the number of illustrated capacitors is merely representative and does not limit the number of capacitors or their relative placement provided by various embodiments. In addition, while the capacitor terminals are labeled Vout and Vss in FIG. 2, the labels are merely representative and are not to be construed as requiring the capacitor terminals to be connected to Vout and Vss voltages.

Figure 3A:
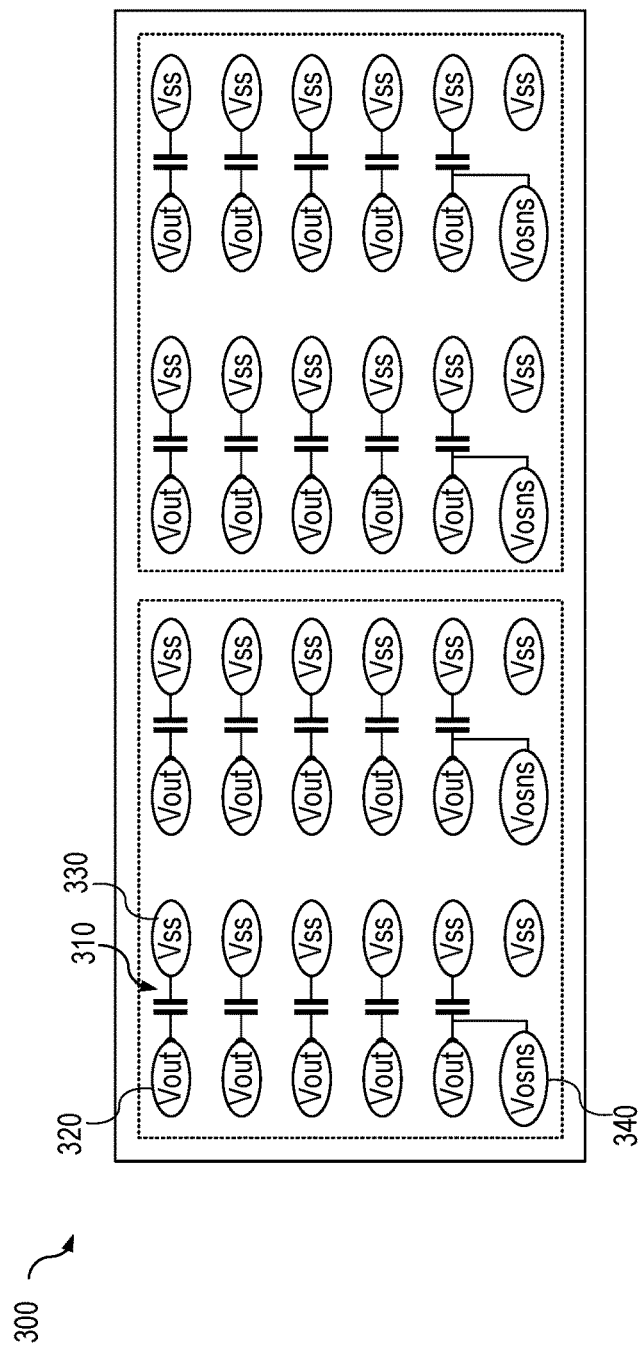
FIG. 3A is a diagram illustrating a representative example of a configurable capacitance chip having a sense terminal according to some aspects of the present disclosure.
Figure 3B:
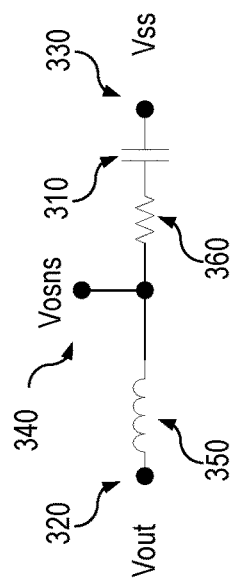
FIG. 3B is a simplified schematic diagram illustrating an electrical connection of the sense terminal internal to the configurable capacitance chip in FIG. 3A according to some aspects of the present disclosure.

FIG. 3A is a diagram illustrating a representative example of a configurable capacitance chip 300 having a sense terminal according to some aspects of the present disclosure. FIG. 3B is a simplified schematic diagram illustrating an electrical connection of the sense terminal internal to the configurable capacitance chip 300 in FIG. 3A according to some aspects of the present disclosure. Referring to FIGS. 3A and 3B, the configurable capacitance chip 300 may include a voltage sense terminal Vosns 340. The voltage sense terminal Vosns 340 may be connected externally to a solder bump (e.g., a solder bump 140) of the configurable capacitance chip 300, and internally to the configurable capacitance chip 300 at the capacitor 310 and may be a connection point of a combination of capacitors the configurable capacitance chip 300. One or more voltage sense terminal Vosns 340 solder bumps may be used per capacitor bank or group of capacitors.

The voltage sense terminal Vosns 340 may enable voltage sensing that minimizes the effect of the ESR 360 and ESL 350 of the capacitor or combination of capacitors. For example, in a voltage regulator application, the voltage sense terminal Vosns 340 may minimize the effects of the parasitic resistance and inductance of the Vout configurable capacitive chip bumps and/or Vout package balls and on the control loop of the voltage regulator. The inductors of the voltage regulator may be terminated on Vout bumps while the control loop feedback can be taken from the Vout sense bump Vosns 340.

Figure 4:
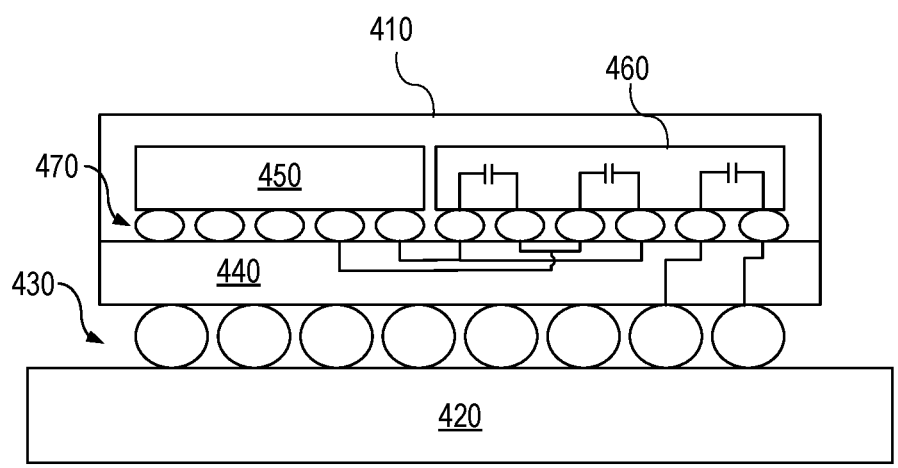
FIG. 4 is a diagram illustrating an example of a configurable capacitance chip within an electronic package according to some aspects of the present disclosure.

FIG. 4 is a diagram illustrating an example of a configurable capacitance chip within an electronic package according to some aspects of the present disclosure. As illustrated in FIG. 4, an electronic package 410 may be mounted on a PCB 420 with a ball grid array 430 or other solder connections connecting a package substrate 440 to the PCB 420. An integrated circuit 450, for example, a voltage regulator, and a configurable capacitance chip 460 may be mounted on the package substrate 440 within the electronic package 410 using solder bumps 470. Electrical connections between the integrated circuit 450 and the configurable capacitance chip 460 may be formed through the solder bump connections to the package substrate 440. Electrical connections between the integrated circuit 450 and electrical connections to the configurable capacitance chip 460 (e.g., Vout, Vss, Vosns) may be brought out to the PCB via the ball grid array 430 or other solder connections connecting a package substrate 440 to the PCB 420.

Electrical connections from integrated circuit 450 and the configurable capacitance chip 460 to the PCB 420 may be formed by the solder bumps 470 and the ball grid array 430. In some implementations, electrical connections between the capacitors on the configurable capacitance chip 460 may be fabricated on the substrate of the configurable capacitance chip 460, on a substrate 440 of the electronic package 410 to which the configurable capacitance chip 460 is attached, by traces on a PCB 420 to which the electronic package 410 is attached, or by some combination of the electrical connections.

As used herein, the terms "ball" or "package ball" may refer to an electrical connection (e.g., balls 430) between an integrated circuit package, for example, but not limited to, Quad Flat No-lead (QFN) packages, quad flat packs (QFPs), small outline ICs (SOICs), or other types of electronic packages, and a PCB. As used herein, the terms "bump" or "chip bump" may refer to a solder bump connection (e.g., bumps 470) between an integrated circuit chip 450 or configurable capacitance chip 460 and an electronic package substrate 440, or in a chip on board (COB) implementation, between the integrated circuit or configurable capacitance chip and the PCB 420.

Either the substrate 440 of the electronic package 410, the PCB 420, or both, can be used to connect any number of the chip capacitors together to form one or more capacitors having a particular capacitance, ESR and ESL value. By changing the electrical traces on either structure from application to application, a standardized capacitor chip can be configured for multiple applications. For example, in one application, all of the capacitors can be coupled in parallel to provide one large capacitor. In another application, one capacitor may be used for an IC decoupling capacitor, a first group of 10 capacitors may be coupled in parallel to form a decoupling capacitor for a first voltage regulator, a second group of 10 capacitors may be coupled in parallel to form a decoupling capacitor for a second voltage regulator decoupling capacitor. The decoupling capacitors formed by the parallel combinations can provide suitable capacitance, ESR, and ESL values for the first and the second voltage regulators.

Figure 5:
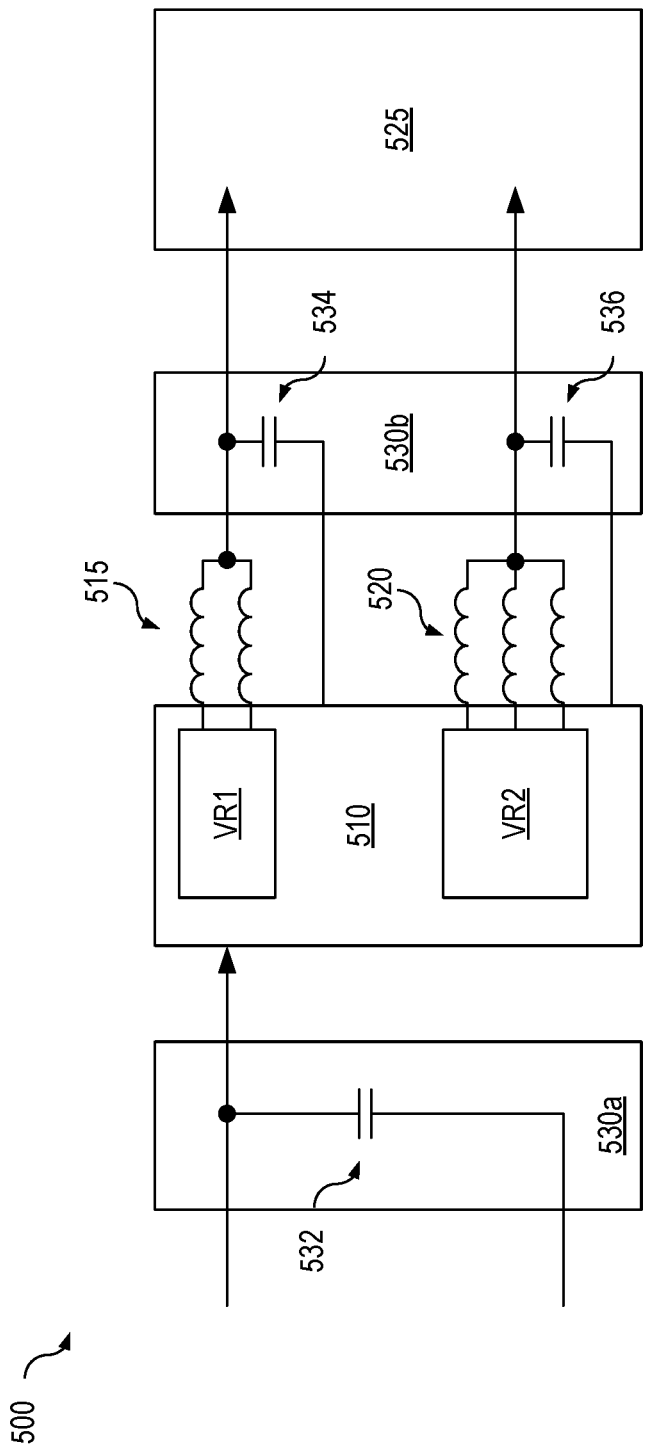
FIG. 5 is a simplified schematic diagram illustrating example circuit connections for an application of a configurable capacitance chip according to some aspects of the present disclosure.

FIG. 5 is a simplified schematic diagram illustrating example circuit connections for an application of a configurable capacitance chip according to some aspects of the present disclosure. As shown in FIG. 5, an application of this configurable capacitor chip may be a dual channel voltage regulator (VR) 500 having a capacitor for each output.

Referring to FIG. 5, the dual channel voltage regulator may include a voltage regulator circuit 510 having a first voltage regulator VR1 and a second voltage regulator VR2. The first voltage regulator VR1 may generate an output current through a first set of inductors 515 to a load 525. The second voltage regulator VR2 may generate an output current through a second set of inductors 520 to the load 525. The configurable capacitance chip 530a, 530b according to the present disclosure may be configured to provide an input capacitor 532 and output capacitors 534, 536 for the voltage regulator circuit 510.

Figure 6:
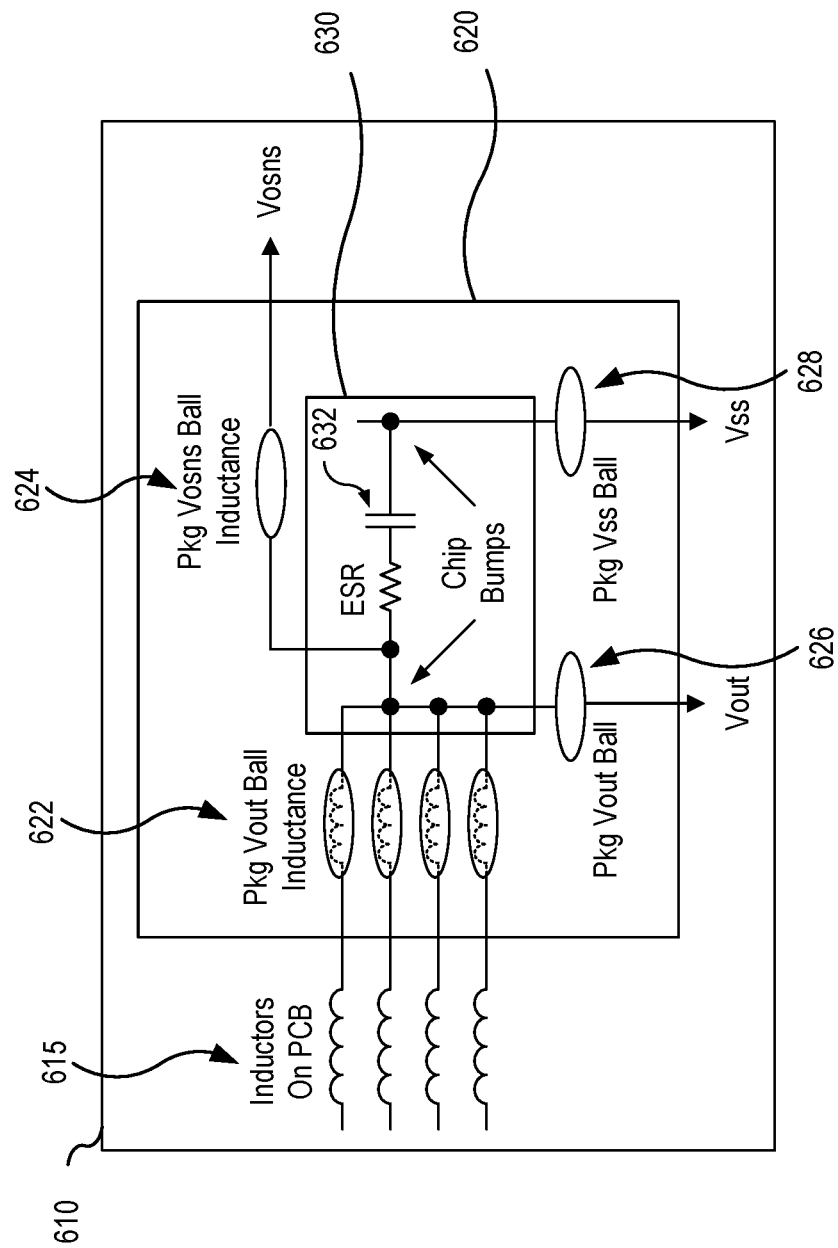
FIG. 6 is a simplified schematic diagram illustrating an example of some parasitic inductances of an electronic package according to some aspects of the present disclosure.

Printed circuit wiring and solder connections to electronic packages contribute parasitic inductances to a circuit. According to some aspects of the present disclosure, the package ball inductance may be incorporated into the output inductor of a circuit, for example a voltage regulator circuit. FIG. 6 is a simplified schematic diagram illustrating an example of some parasitic inductances of an electronic package according to some aspects of the present disclosure.

Referring to FIG. 6, an electronic package 620 may be mounted on the PCB 610 and electrically connected to the PCB 610 via package balls as previously described. A configurable capacitance chip 630 may be mounted within the electronic package 620 via chip bumps as previously described. A voltage regulator circuit (not shown) may include inductors 615 on a PCB 610. The inductors may be, for example, but not limited to, discrete component inductors, inductor traces formed on a surface of the PCB 610, inductor traces integrated within multiple layers of the PCB 610, etc.

One or more package balls 622 per inductor may be included as part of each of the PCB inductors 615. Incorporating the package ball inductance with the PCB inductors can reduce the effective ESL and ESR of the capacitor 632 affecting the control loop by sensing the output voltage via the Vosns package ball 624 as shown. The Vout and Vss connections for the voltage regulator circuit may be brought out via the package Vout ball 626 and the package Vss ball 628. The Vout connection via the package Vout ball 626 may similarly reduce the output ripple by reducing the effective ESR and ESL of the capacitor 632.

Figure 7:
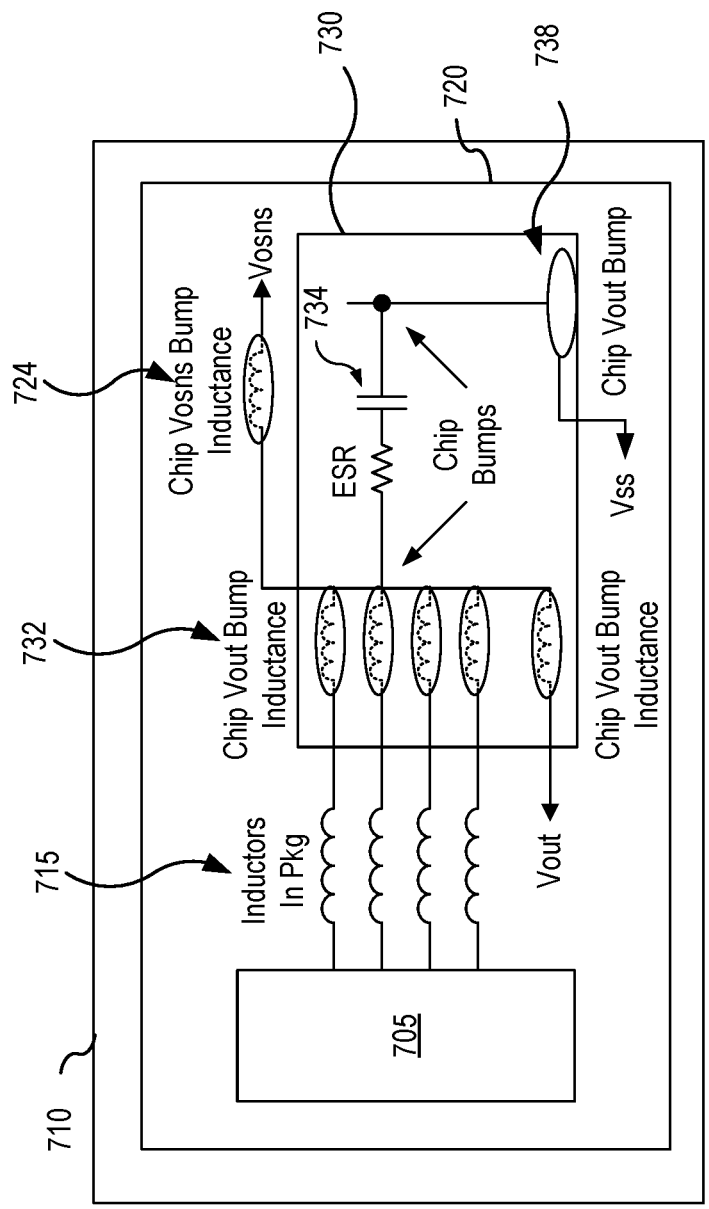
FIG. 7 is a simplified schematic diagram illustrating another example of some parasitic inductances of an electronic package according to some aspects of the present disclosure.

In some embodiments one or more inductors may be integrated within the electronic package substrate. FIG. 7 is a simplified schematic diagram illustrating another example of some parasitic inductances of an electronic package according to some aspects of the present disclosure. Referring to FIG. 7, a configurable capacitance chip 730 may be mounted within the electronic package 720 via chip bumps as previously described. The electronic package 720 may be mounted on a PCB 710 via package balls as previously described. A voltage regulator circuit 705 may be an integrated circuit included in the electronic package 720. The voltage regulator circuit 705 may be mounted within the electronic package 720 via chip bumps as previously described. Output inductors 715 for the voltage regulator circuit 705 may be, for example, but not limited to, discrete component inductors, inductor traces formed on a surface of the substrate of the electronic package 720, inductor traces integrated within multiple layers of the electronic package substrate, etc.

One or more chip bumps 732 per inductor may be included as part of each of the output inductors 715. Incorporating the chip bump inductance with the output inductors 715 can reduce the effective ESL and ESR of the capacitor 734 affecting the control loop by sensing the output voltage via the Vosns chip bump 724 as shown. The Vout and Vss connections for the voltage regulator circuit may be brought out via the Vout chip bump 732 and the Vss chip bump 738.

Figure 8:
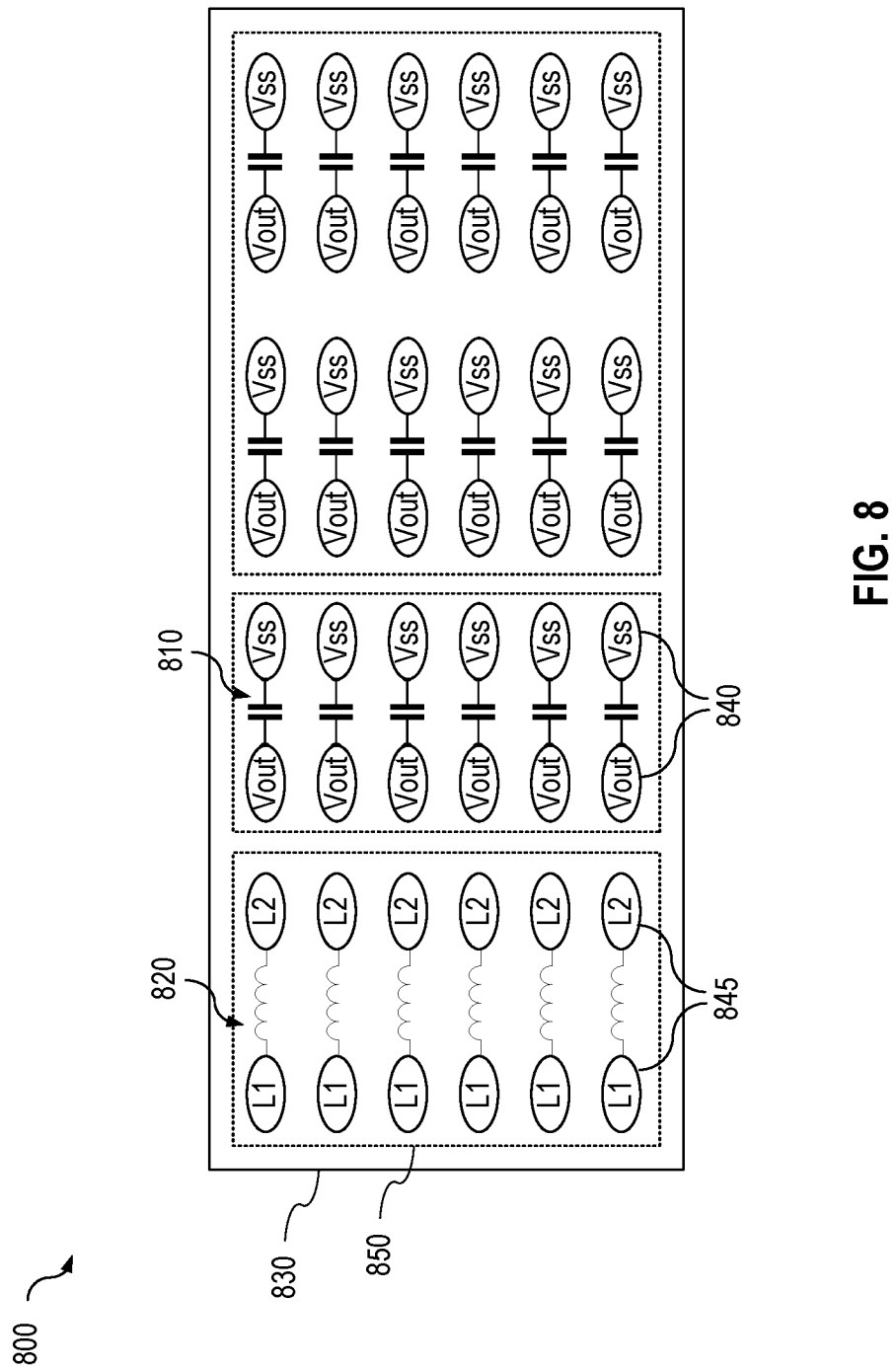
FIG. 8 is a diagram illustrating a representative example of a configurable capacitance-inductance chip according to some aspects of the present disclosure.

In accordance with some aspects of the present disclosure, various embodiments of the configurable capacitance chip may include additional configurable components such as resistors and inductors. FIG. 8 is a diagram illustrating a representative example of a configurable capacitance-inductance chip 800 according to some aspects of the present disclosure. Referring to FIG. 8, the configurable capacitance-inductance chip 800 may include a plurality of capacitors 810 and a plurality of inductors 820 fabricated on a first surface of a substrate 830. Each capacitor 810 and each inductor 820 may be electrically connected to a pair of contacts 840, 845, respectively, fabricated on the first surface of the substrate 830. The contacts 840, 845 fabricated on the first surface of the substrate 830 may be referred to herein as chip bumps. The chip bumps may be, for example, solder bumps.

The bumps may be fabricated similarly to the bumps as described with respect to FIG. 1. Also, as described with respect to FIG. 1, in some implementations, the capacitors 810 and the inductors 820 may be grouped into banks 850. In some implementations, the capacitors 810 and the inductors 820 may not be grouped into banks. In some implementations, the configurable capacitance-inductance chip 800 may include one or more voltage sense terminals Vosns as described with respect to FIG. 3.

In some embodiments, a range of capacitance for each integrated capacitor can be between 10 and 10,000 nanofarads, in another embodiment can be between 50 and 5,000 nanofarads and in one embodiment between 50 and 500 nanofarads. In some embodiments, multiple capacitor 110 may be combined to provide larger or smaller capacitance values.

In some embodiments a range of inductance for each integrated inductors can be between 1 picohenry and 100 nanohenrys, in another embodiment can be between 100 picohenrys and 10 nanohenrys and in one embodiment between 1 and 5 nanohenrys.

It should be appreciated that FIG. 8 is a stylized representation of the configurable capacitance-inductance chip according to some aspects of the present disclosure, and is provided for ease of explanation. The figure is not meant to illustrate representative dimensions of any elements of the configurable capacitance-inductance chip. Further, the number of illustrated capacitors and inductors are merely representative and does not limit the number of capacitors and inductors or their relative placement provided by various embodiments. In addition, while the capacitor contacts 840 are labeled Vout and Vss in FIG. 8, the labels are merely representative and are not to be construed as requiring the capacitor contacts 840 to be connected to Vout and Vss voltages.

Figure 9:
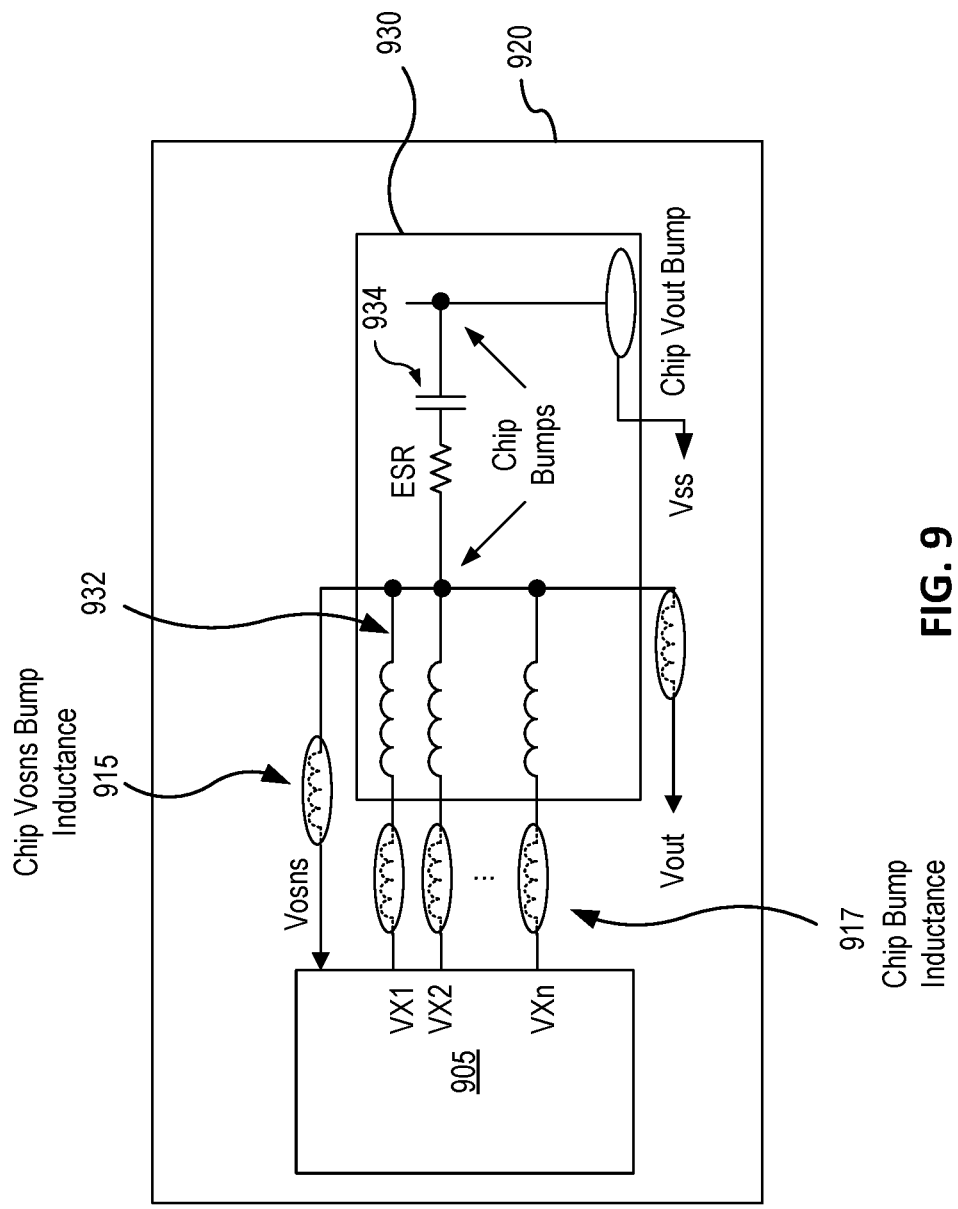
FIG. 9 is a simplified schematic diagram illustrating an example application of configurable capacitance-inductance chip according to some aspects of the present disclosure.

FIG. 9 is a simplified schematic diagram illustrating an example application of configurable capacitance-inductance chip according to some aspects of the present disclosure. Referring to FIG. 9, a configurable capacitance-inductance chip 930 may be mounted within the electronic package 920 via chip bumps as previously described. The electronic package 920 may be mounted on a PCB via package balls as previously described. A voltage regulator circuit 905 may be an integrated circuit included in the electronic package 920. The voltage regulator circuit 905 may be mounted within the electronic package 920 via chip bumps as previously described. In some implementations, the configurable capacitance-inductance chip and the voltage regulator circuit may be mounted directly to the PCB via the chip bumps.

Output inductors and capacitors for the voltage regulator circuit 905 may be provided by the inductors 932 and capacitors 934 of the configurable capacitance inductance chip 930. In some implementations, one or more chip bumps 917 per inductor may be included as part of each of the output inductors 932. Incorporating the chip bump 917 inductance with the output inductors 932 can reduce the effective ESL and ESR of the capacitor 934 affecting the control loop by sensing the output voltage via the Vosns chip bump 915 as shown.

Figure 10:
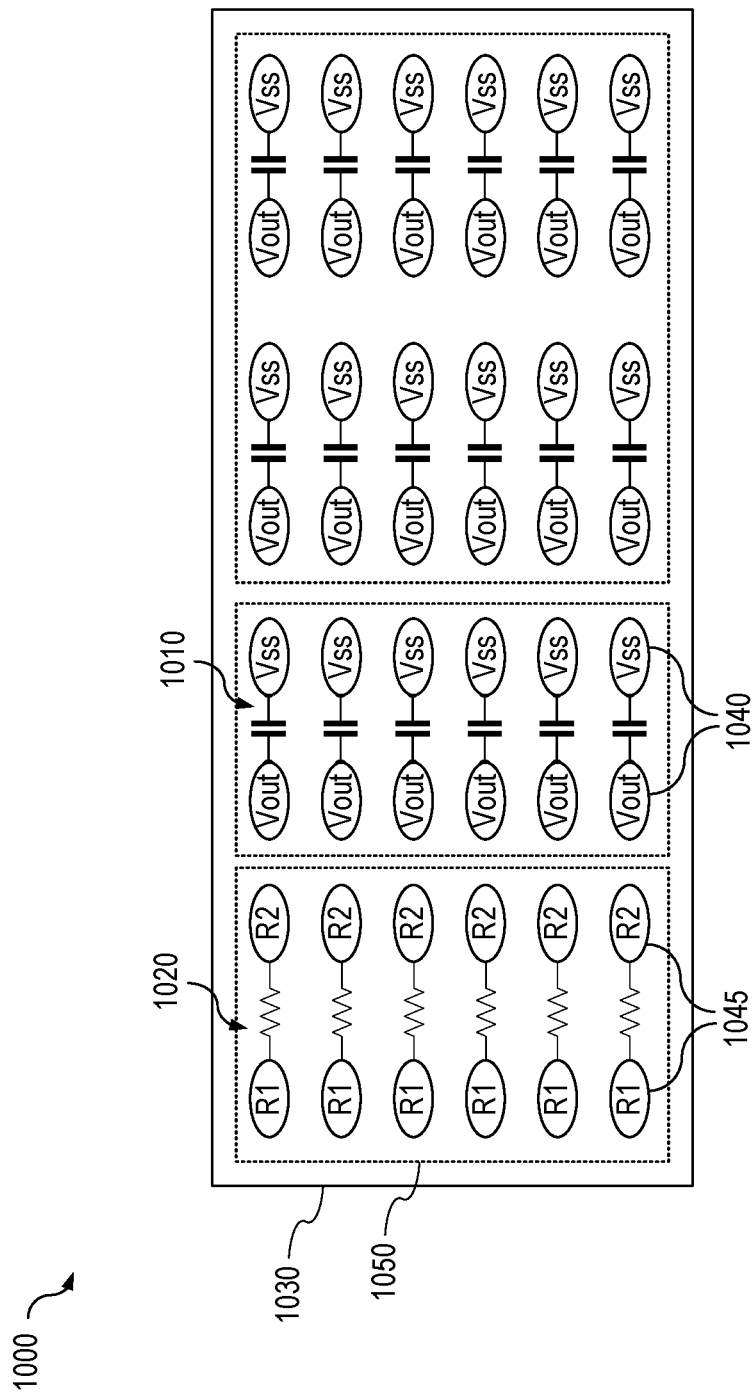
FIG. 10 is a diagram illustrating a representative example of a configurable capacitance-resistance chip according to some aspects of the present disclosure.

FIG. 10 is a diagram illustrating a representative example of a configurable capacitance-resistance chip 1000 according to some aspects of the present disclosure. Referring to FIG. 10, the configurable capacitance-resistance chip 1000 may include a plurality of capacitors 1010 and a plurality of resistors 1020 fabricated on a first surface of a substrate 1030. Each capacitor 1010 and each resistors 1020 may be electrically connected to a pair of contacts 1040, 1045, respectively, fabricated on the first surface of the substrate 1030. The contacts 1040, 1045 fabricated on the first surface of the substrate 1030 may be referred to herein as chip bumps. The chip bumps may be, for example, solder bumps.

The bumps may be fabricated similarly to the bumps as described with respect to FIG. 1. Also, as described with respect to FIG. 1, in some implementations, the capacitors 1010 and the resistors 1020 may be grouped into banks 1050. In some implementations, the capacitors 1010 and the resistors 1020 may not be grouped into banks. In some implementations, the configurable capacitance-resistance chip 1000 may include one or more voltage sense terminals Vosns as described with respect to FIG. 3

In some embodiments, a range of capacitance for each integrated capacitor can be between 10 and 10,000 nanofarads, in another embodiment can be between 50 and 5,000 nanofarads and in one embodiment between 50 and 500 nanofarads. In some embodiments, multiple capacitors 1010 may be combined to provide larger or smaller capacitance values.

In some embodiments, a range of resistance for each integrated resistor can be between 50 ohms and ten thousand ohms. Other resistance ranges may be possible. In some embodiments, multiple resistors 1020 may be combined to provide larger or smaller resistance values.

It should be appreciated that FIG. 10 is a stylized representation of the configurable capacitance-resistance chip according to some aspects of the present disclosure, and is provided for ease of explanation. The figure is not meant to illustrate representative dimensions of any elements of the configurable capacitance-resistance chip. Further, the number of illustrated capacitors and resistors are merely representative and does not limit the number of capacitors and resistors or their relative placement provided by various embodiments. In addition, while the capacitor contacts 1040 are labeled Vout and Vss in FIG. 10, the labels are merely representative and are not to be construed as requiring the capacitor contacts 1040 to be connected to Vout and Vss voltages.

Figure 11:
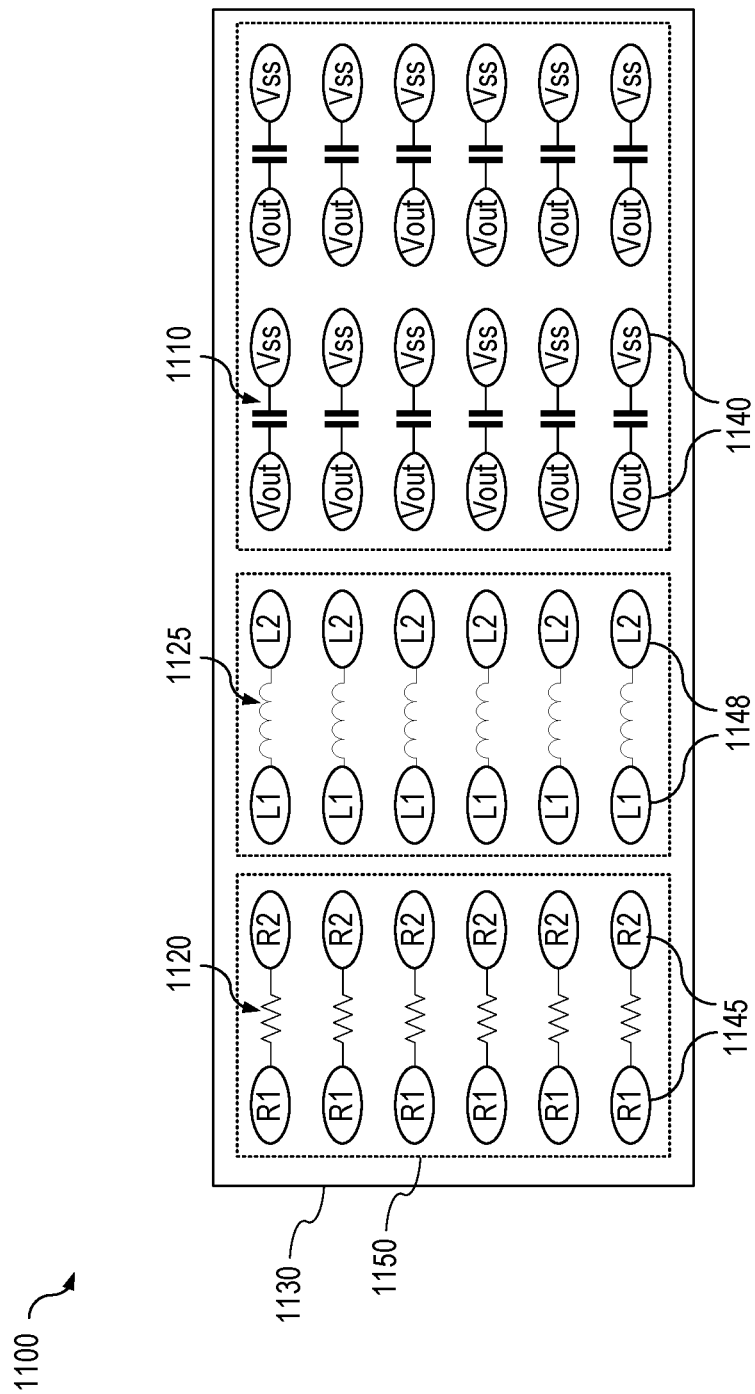
FIG. 11 is a diagram illustrating a representative example of a configurable capacitance-resistance-inductance chip according to some aspects of the present disclosure.

FIG. 11 is a diagram illustrating a representative example of a configurable capacitance-resistance-inductance chip 1100 according to some aspects of the present disclosure. Referring to FIG. 11, the configurable capacitance-resistance-inductance chip 1100 may include a plurality of capacitors 1110, a plurality of resistors 1120, and a plurality of inductors 1125 fabricated on a first surface of a substrate 1130. Each capacitor 1110, each resistor 1120, and each inductor 1125 may be electrically connected to a pair of contacts 1140, 1145, 1148, respectively, fabricated on the first surface of the substrate 1130.

The contacts 1140, 1145, 1148 fabricated on the first surface of the substrate 1130 may be referred to herein as chip bumps. The chip bumps may be, for example, solder bumps. The bumps may be fabricated similarly to the bumps as described with respect to FIG. 1. Also, as described with respect to FIG. 1, in some implementations, the capacitors 1110, the resistors 1120, and the inductors 1125 may be grouped into banks 1150. In some implementations, the capacitors 1110, the resistors 1120, and the inductors 1125 may not be grouped into banks. In some implementations, the configurable capacitance-resistance-inductance chip 1100 may include one or more voltage sense terminals Vosns as described with respect to FIG. 3.

In some embodiments, a range of capacitance for each integrated capacitor can be between 10 and 10,000 nanofarads, in another embodiment can be between 50 and 5,000 nanofarads and in one embodiment between 50 and 500 nanofarads. In some embodiments, multiple capacitors 1110 may be combined to provide larger or smaller capacitance values.

In some embodiments, a range of resistance for each integrated resistor can be between 50 ohms and ten thousand ohms. Other resistance ranges may be possible. In some embodiments, multiple resistors 1120 may be combined to provide larger or smaller capacitance values.

In some embodiments a range of inductance for each integrated inductors can be between 1 picohenry and 100 nanohenrys, in another embodiment can be between 100 picohenrys and 10 nanohenrys and in one embodiment between 1 and 5 nanohenrys. In some embodiments, multiple inductors 1125 may be combined to provide larger or smaller inductance values.

It should be appreciated that FIG. 11 is a stylized representation of the configurable capacitance-resistance-inductance chip according to some aspects of the present disclosure, and is provided for ease of explanation. The figure is not meant to illustrate representative dimensions of any elements of the configurable capacitance-resistance-inductance chip. Further, the number of illustrated capacitors, resistors, and inductors are merely representative and does not limit the number of capacitors, resistors, and inductors or their relative placement provided by various embodiments. In addition, while the capacitor contacts 1140 are labeled Vout and Vss in FIG. 11, the labels are merely representative and are not to be construed as requiring the capacitor contacts 1140 to be connected to Vout and Vss voltages.

Figure 12:
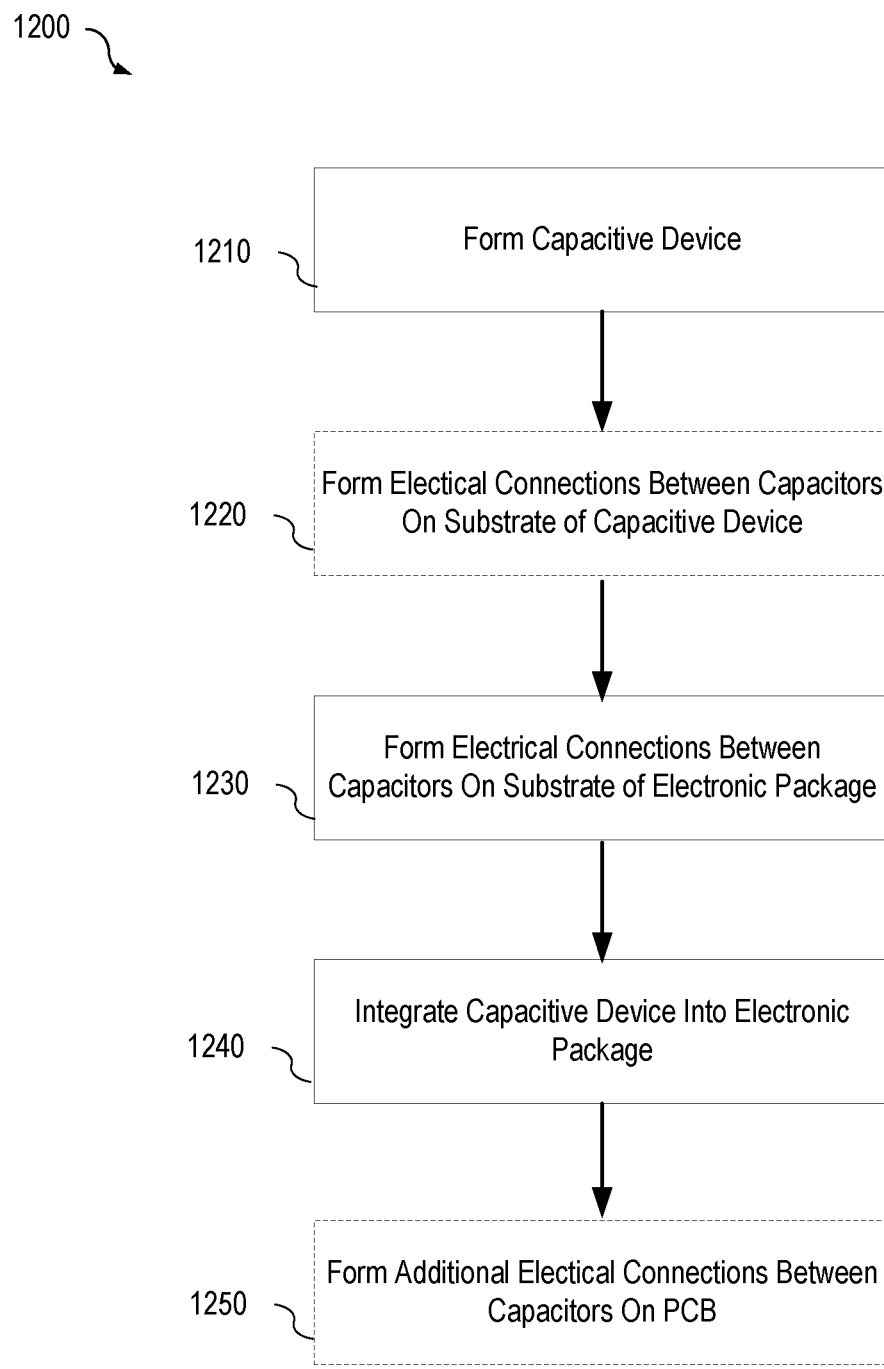
FIG. 12 is a flowchart illustrating an example of a method for making a configurable capacitance device according to some aspects of the present disclosure.

FIG. 12 is a flowchart illustrating an example of a method 1200 for making a configurable integrated circuit (IC) capacitive device according to some aspects of the present disclosure. Referring to FIG. 12, at block 1210, a capacitive device may be formed. The capacitive device may be fabricated using standard semiconductor processing techniques. A plurality of capacitors may be fabricated on a first surface of a substrate. Each capacitor may be electrically connected to a pair of contacts fabricated on the first surface of the substrate 120. The contacts fabricated on the first surface of the substrate may be referred to herein as chip bumps. The chip bumps may be, for example, solder bumps.

At optional block 1220, electrical connections between capacitors may be formed on the substrate of the capacitive device. In some embodiments, multiple capacitors may be combined to provide larger or smaller capacitance values. The combined capacitors may be referred to as capacitor banks. The capacitor banks may be formed, for example, by electrical connections fabricated on the second surface of the substrate.

At block 1230, electrical connections between capacitors may be formed on a substrate of an electronic package. The additional electrical connections may be fabricated as circuit traces on the substrate of the electronic package into which the capacitive device will be integrated. Conductive traces on the substrate of the electronic package may provide electrical connections between the chip bumps to configure the capacitors on the capacitive device.

At block 1240, the capacitive device may be integrated into the electronic package. Electrical connections may be formed between the substrate of the capacitive device and the substrate of the electronic package. For example, the solder bumps on the substrate of the capacitive device may be electrically connected to the conductive traces on the substrate of the electronic package. The electrical connections between the capacitors formed by the conductive traces on the substrate of the electronic package may form the desired capacitance values.

At optional block 1250, additional electrical connections between capacitors may be formed conductive traces on the PCB to which the electronic package is attached. The combined electrical connections between the capacitors formed by the conductive on the PCB and conductive traces on the substrate of the electronic package may form the desired capacitance values.

The specific operations illustrated in FIG. 12 provide a particular method for making a configurable integrated circuit (IC) capacitor according to an embodiment of the present disclosure. Other sequences of operations may also be performed according to alternative embodiments. For example, alternative embodiments of the present disclosure may perform the operations outlined above in a different order. Moreover, the individual operations illustrated in FIG. 12 may include multiple sub-operations that may be performed in various sequences as appropriate to the individual operation. Furthermore, additional operations may be added or removed depending on the particular applications.

According to some aspects of the present disclosure, a configurable capacitors in an integrated package is provided. As used below, any reference to a series of examples is to be understood as a reference to each of those examples disjunctively (e.g., "Examples 1-4" is to be understood as "Examples 1, 2, 3, or 4").

Example 1 is a configurable capacitance device, having a semiconductor substrate including a plurality of integrally formed capacitors; and a separate interconnect structure coupled to the semiconductor substrate, wherein the separate interconnect structure is configurable to electrically couple two or more of the plurality of integrally formed capacitors together in a parallel configuration.

Example 2 is the configurable capacitance device of example 1, wherein the separate interconnect structure is configurable to couple two or more of the plurality of integrally formed capacitors together to form a first capacitor having a first combined capacitance, the separate interconnect structure is configurable to couple two or more of the plurality of integrally formed capacitors together to form a second capacitor having a second combined capacitance; and the first combined capacitance is greater than the second combined capacitance.

Example 3 is the configurable capacitance device of example(s) 1 or 2, wherein the separate interconnect structure is configurable to couple each the plurality of integrally formed capacitors together to form a single capacitor having a combined capacitance.

Example 4 is the configurable capacitance device of example(s) 1-3, wherein: the two or more of the plurality of integrally formed capacitors coupled together in a parallel configuration comprise a first capacitor having a first combined capacitance, and the separate interconnect structure is configurable to couple two or more of the plurality of integrally formed capacitors together in a series configuration to form a second capacitor having a second combined capacitance.

Example 5 is the configurable capacitance device of example(s) 1-4, wherein the separate interconnect structure comprises a plurality of electrical conductors configured to extend between two or more of the plurality of integrally formed capacitors.

Example 6 is the configurable capacitance device of example(s) 1-5, wherein the separate interconnect structure is formed on a substrate of an integrated circuit (IC) package to which the semiconductor substrate is attached, by traces on a printed circuit board to which the IC package is attached, or by a combination thereof.

Example 7 is the configurable capacitance device of example(s) 1-6, further including a sense conductor that is electrically connected to at least one of the plurality of integrally formed capacitors on the semiconductor substrate.

Example 8 is the configurable capacitance device of example(s) 1-7, wherein the semiconductor substrate further comprises a plurality of inductors, wherein the separate interconnect structure is configurable to electrically couple two or more of the plurality of inductors together to form a single inductor having a combined inductance.

Example 9 is the configurable capacitance device of example(s) 1-8, wherein the separate interconnect structure is configurable to electrically couple at least one of the plurality of integrally formed capacitors together with at least one of the plurality of inductors to form an inductor-capacitor circuit.

Example 10 is the configurable capacitance device of example(s) 1-9, wherein: the semiconductor substrate further comprises a plurality of resistors, and the separate interconnect structure is configurable to electrically couple two or more of the plurality of resistors together to form a single resistor having a combined resistance.

Example 11 is the configurable capacitance device of example(s) 1-10, wherein: the semiconductor substrate includes a plurality of first interconnects, wherein each pair of the plurality of first interconnects is coupled to a respective capacitor of the plurality of integrally formed capacitors, and the separate interconnect structure includes a plurality of second interconnects corresponding with and coupled to the plurality of first interconnects.

Example 12 is a configurable capacitance system, including: an electronic package; a multi-capacitor device disposed within the electronic package, the multi-capacitor device having a semiconductor substrate including a plurality of integrally formed capacitors; an integrated circuit (IC) disposed within the electronic package, the IC operable to perform a circuit function; and an interconnect structure forming a portion of the electronic package, wherein the interconnect structure is configurable to electrically couple two or more of the plurality of integrally formed capacitors together in a parallel configuration, and to couple the parallel configuration to the IC.

Example 13 is the configurable capacitance system of example 12, wherein: the interconnect structure is configurable to couple two or more of the plurality of integrally formed capacitors together to form a first capacitor having a first combined capacitance, the interconnect structure is configurable to couple two or more of the plurality of integrally formed capacitors together to form a second capacitor having a second combined capacitance; and the first combined capacitance is greater than the second combined capacitance.

Example 14 is the configurable capacitance system of example(s) 12 or 13, wherein the interconnect structure is configurable to couple each the plurality of integrally formed capacitors together to form a single capacitor having a combined capacitance.

Example 15 is the configurable capacitance system of example(s) 12-14, wherein: the two or more of the plurality of integrally formed capacitors coupled together in a parallel configuration comprise a first capacitor having a first combined capacitance, and the interconnect structure is configurable to couple two or more of the plurality of integrally formed capacitors together in a series configuration to form a second capacitor having a second combined capacitance.

Example 16 is the configurable capacitance system of example(s) 12-15, wherein the interconnect structure comprises a plurality of electrical conductors configured to extend between two or more of the plurality of integrally formed capacitors, and between the two or more of the plurality of integrally formed capacitors and the IC.

Example 17 is the configurable capacitance system of example(s) 12-16, wherein interconnect structure is formed on a substrate of an integrated circuit (IC) package to which the semiconductor substrate is attached, by traces on a printed circuit board to which the IC package is attached, or by a combination thereof.

Example 18 is the configurable capacitance system of claims 12-17, further including: forming a sense conductor that is electrically connected to at least one of the plurality of capacitors and to a sense contact formed on the mating surface of the semiconductor substrate.

Example 19 is configurable capacitance device, including: a semiconductor substrate including a plurality of integrally formed capacitors; and a separate interconnect structure coupled to the semiconductor substrate, wherein the separate interconnect structure is configurable to electrically couple two or more of the plurality of integrally formed capacitors together in at least one of a series configuration or a parallel configuration.

Example 20 is the method of example 19, further including: a sense conductor that is electrically connected to at least one of the plurality of integrally formed capacitors on the semiconductor substrate.

The examples and embodiments described herein are for illustrative purposes only. Various modifications or changes in light thereof will be apparent to persons skilled in the art. These are to be included within the spirit and purview of this application, and the scope of the appended claims, which follow.

What is claimed is:

1. A configurable capacitance device, comprising:
a configurable capacitance chip including a plurality of integrally formed capacitors, each capacitor formed at a first surface of the configurable capacitance chip; and
a separate interconnect board coupled to the configurable capacitance chip and arranged to electrically couple two or more of the plurality of integrally formed capacitors together in a parallel configuration, wherein the separate interconnect board forms a portion of an electronic package that is arranged to be electrically coupled to a printed circuit board and includes a plurality of electrical conductors extending between two or more of the plurality of integrally formed capacitors, wherein: the separate interconnect board is configurable to couple two or more of the plurality of integrally formed capacitors together to form a first capacitor having a first combined capacitance, and the separate interconnect board is configurable to couple two or more of the plurality of integrally formed capacitors together to form a second capacitor having a second combined capacitance; wherein the first combined capacitance is greater than the second combined capacitance.

2. The configurable capacitance device of claim 1, wherein the separate interconnect board is configurable to couple each the plurality of integrally formed capacitors together to form a single capacitor having a combined capacitance.

3. The configurable capacitance device of claim 1, wherein:
the two or more of the plurality of integrally formed capacitors coupled together in a parallel configuration comprise a first capacitor having a first combined capacitance, and
the separate interconnect board is configurable to couple two or more of the plurality of integrally formed capacitors together in a series configuration to form a second capacitor having a second combined capacitance.

4. The configurable capacitance device of claim 1, further comprising a sense conductor that is electrically connected to at least one of the plurality of integrally formed capacitors on the configurable capacitance chip.

5. The configurable capacitance device of claim 1, wherein the configurable capacitance chip further comprises a plurality of inductors,
wherein the separate interconnect board is configurable to electrically couple two or more of the plurality of inductors together to form a single inductor having a combined inductance.

6. The configurable capacitance device of claim 5, wherein the separate interconnect board is configurable to electrically couple at least one of the plurality of integrally formed capacitors together with at least one of the plurality of inductors to form an inductor-capacitor circuit.

7. The configurable capacitance device of claim 1, wherein:
the configurable capacitance chip further comprises a plurality of resistors, and
the separate interconnect board is configurable to electrically couple two or more of the plurality of resistors together to form a single resistor having a combined resistance.

8. The configurable capacitance device of claim 1, wherein:
the configurable capacitance chip includes a plurality of first interconnects, wherein each pair of the plurality of first interconnects is coupled to a respective capacitor of the plurality of integrally formed capacitors, and
the separate interconnect board includes a plurality of second interconnects corresponding with and coupled to the plurality of first interconnects.

9. An electronic device, comprising:
a configurable capacitance device including a plurality of integrally formed capacitors, each capacitor formed at a first surface of the configurable capacitance device; and a separate interconnect board coupled to the configurable capacitance device and arranged to electrically couple two or more of the plurality of integrally formed capacitors together in a series configuration, wherein the separate interconnect board forms a portion of an electronic package that is arranged to be electrically coupled to a circuit board and includes a plurality of electrical conductors extending between two or more of the plurality of integrally formed capacitors, wherein: the separate interconnect board is configurable to couple two or more of the plurality of integrally formed capacitors together to form a first capacitor having a first combined capacitance, and the separate interconnect board is configurable to couple two or more of the plurality of integrally formed capacitors together to form a second capacitor having a second combined capacitance; wherein the first combined capacitance is greater than the second combined capacitance.

10. The electronic device of claim 9, wherein the separate interconnect board is configurable to couple each the plurality of integrally formed capacitors together to form a single capacitor having a combined capacitance.

11. The electronic device of claim 10, wherein:
the two or more of the plurality of integrally formed capacitors coupled together in a series configuration comprise a first capacitor having a first combined capacitance, and
the separate interconnect board is configurable to couple two or more of the plurality of integrally formed capacitors together in a parallel configuration to form a second capacitor having a second combined capacitance.

12. The electronic device of claim 9, further comprising a sense conductor that is electrically connected to at least one of the plurality of integrally formed capacitors on the configurable capacitance device.

13. The electronic device of claim 9, wherein the configurable capacitance device further comprises a plurality of inductors,
wherein the separate interconnect board is configurable to electrically couple two or more of the plurality of inductors together to form a single inductor having a combined inductance.

14. The electronic device of claim 13, wherein the separate interconnect board is configurable to electrically couple at least one of the plurality of integrally formed capacitors together with at least one of the plurality of inductors to form an inductor-capacitor circuit.

15. The electronic device of claim 9, wherein:
the configurable capacitance device further comprises a plurality of resistors, and the separate interconnect board is configurable to electrically couple two or more of the plurality of resistors together to form a single resistor having a combined resistance.

16. The electronic device of claim 9, wherein:

the configurable capacitance device includes a plurality of first interconnects, wherein each pair of the plurality of first interconnects is coupled to a respective capacitor of the plurality of integrally formed capacitors, and the separate interconnect board includes a plurality of second interconnects corresponding with and coupled to the plurality of first interconnects.

* * * * *